(12) United States Patent
Hsieh

(10) Patent No.: US 7,246,286 B2
(45) Date of Patent: Jul. 17, 2007

(54) TESTING METHODS AND CHIPS FOR PREVENTING ASNCHRONOUS SAMPLING ERRORS

(75) Inventor: I-Lin Hsieh, Taipei (TW)

(73) Assignee: Via Technologies, Inc., Taipei (TW)

( * ) Notice: Subject to any disclaimer, the term of this patent is extended or adjusted under 35 U.S.C. 154(b) by 185 days.

(21) Appl. No.: 11/147,736

(22) Filed: Jun. 8, 2005

(65) Prior Publication Data

US 2006/0107137 A1    May 18, 2006

(30) Foreign Application Priority Data

Oct. 26, 2004    (TW) .............................. 93132343 A

(51) Int. Cl.
*G01R 31/28* (2006.01)

(52) U.S. Cl. .................. 714/731; 714/25; 714/700; 714/707; 714/718; 714/724; 714/734; 714/744; 365/233; 327/291; 375/354; 713/500; 326/93; 702/89

(58) Field of Classification Search ..................... None
See application file for complete search history.

(56) References Cited

U.S. PATENT DOCUMENTS

| | | | | |
|---|---|---|---|---|
| 6,175,603 B1 * | 1/2001 | Chapman et al. | ........... | 375/354 |
| 6,441,666 B1 * | 8/2002 | Swanson et al. | ............ | 327/291 |
| 6,614,263 B2 * | 9/2003 | Nadeau-Dostie et al. | ..... | 326/93 |
| 6,675,311 B2 * | 1/2004 | Hotta et al. | ................. | 713/500 |
| 6,870,384 B1 * | 3/2005 | Ricca | ......................... | 324/763 |
| 7,016,257 B2 * | 3/2006 | Kim et al. | .................. | 365/233 |
| 7,069,458 B1 * | 6/2006 | Sardi et al. | ................. | 713/401 |
| 2004/0187058 A1 * | 9/2004 | Yamada et al. | ............. | 714/726 |
| 2005/0166104 A1 * | 7/2005 | Rich et al. | .................. | 714/724 |

* cited by examiner

*Primary Examiner*—Guy Lamarre
*Assistant Examiner*—John P Trimmings
(74) *Attorney, Agent, or Firm*—Thomas, Kayden, Horstemeyer & Risley

(57) ABSTRACT

Testing methods and chips preventing sampling errors caused by asynchronous effect. The chip comprises a first logic portion driven by a first clock signal with a first operating frequency, and a second logic portion driven by a second clock signal with a second operating frequency. The first operating frequency is higher than the second operating frequency, and is not an integral multiple of the second operating frequency. In the test method, a third operating frequency of a third clock signal is generated according to the second clock signal, in which the third operating frequency is higher than the first operating frequency and is an integral multiple of the second operating frequency. The first clock signal is replaced by the third clock signal and the first logic portion is tested by the third clock signal. The second logic portion is tested by the second clock signal.

24 Claims, 5 Drawing Sheets

TESTING METHODS AND CHIPS FOR PREVENTING ASNCHRONOUS SAMPLING ERRORS

BACKGROUND

The invention relates to a testing method of a chip, and more particularly, to a testing method of a chip for preventing sampling errors due to asynchronous effect.

Chip testing is done during manufacture process to confirm the manufacturing quality. When testing, ideal output of chips under specific input is simulated by a computer and then recorded. The specific input is then applied to the chips and the real output and the ideal output of the chips are compared to identify if there have manufacturing defects of the chip.

Different operation frequencies are required for various electronic devices. For example, a chip is capable of two different operating frequencies. However because the asynchronous effect, it is difficult to test a chip capable of two different operating frequencies.

Asynchronous effect is described with reference to FIGS. 1 and 2. FIG. 1 shows a flip-flop circuit which might be included in a chip.

As shown in FIG. 1, an input signal D2 is sampled by a flip-flop 2 according to the clock signal CLK2, and then generating an output signal Q2. Another input signal D1 is sampled by a flip-flop 1 according to the clock signal CLK1, and then generating an output signal Q1. Wherein the input signal D1 of the flip-flop 1 is the output signal Q2 of the flip-flop 2 after passing through a logic circuit Lg. However, latency between the signals Q2 and D1 is dependent on the logic circuit Lg, which may be 1.7~2.3 nano-seconds (ns).

FIG. 2 shows a wave diagram of the clock signals CLK1 and CLK2 of FIG. 1. The operating frequency of CLK1 is higher than CLK2; and the operating frequency of CLK1 is not integral times to CLK2. For example, the operating frequency of CLK1 may be 250 MHz and the operating frequency of CLK2 may be 66 MHz.

The output signal Q2 is input to the logic circuit Lg after sampling the input signal D2 at 30 ns by the flip-flop 2. If the latency of the logic circuit Lg is 1.7 ns~2.3 ns, the input signal D1 is output from the logic circuit at 31.7 ns~32.3 ns. As a result, according to the CLK1, the flip-flop 1 would sample the input signal D1 at 32 ns or at 36 ns. Obviously, there has two different sampling timing in one clock signal CLK1 which will cause the sampling error in flip-flop 1, and that is called the asynchronous effect.

Similarly, as shown in FIG. 2, the asynchronous effect exists no matter the input signal D2 is sampled at 15 ns and the latency of the logic circuit Lg is 0.8 ns~1.2 ns, or the input signal D2 is sampled at 45 ns and the latency of the logic circuit Lg is 2.8ns ~3.2 ns.

In order to prevent asynchronous effect, latency of the logic circuit Lg cannot exceed 1 ns(0.8 ns~1.2 ns), 2 ns(1.7 ns~2.3 ns) or 3 ns(2.8 ns~3.2 ns). It is difficult to design a chip with the limitation of logic circuit latency.

SUMMARY

The invention provides a testing method of a chip for preventing testing error caused by the asynchronous effect.

In one aspect, the testing method of a chip in the present invention, in which a first logic portion of the chip is driven by a first clock signal with a first operating frequency and a second logic portion is driven by a second clock signal with a second operating frequency. A third clock signal with a third operating frequency is generated in which the third operating frequency is higher than a first operating frequency and is an integral multiple of the second operating frequency. The first logic portion is tested by to the third clock signal, rather than the first clock signal. The first operating frequency exceeding the second operating frequency and is not an integral multiple of the second operating frequency.

In another aspect, the invention discloses a chip including a first logic portion, a second logic portion, a clock generation unit and a selection device. The clock generation unit generates a first clock signal with a first operating frequency, a second clock signal with a second operating frequency and a third clock signal with a third operating frequency. The first operating frequency is higher than the second operating frequency and is not an integral multiple of the second operating frequency. The third operating frequency is higher than the first operating frequency and is an integral multiple of the second operating frequency. The first logic portion is driven by the first clock signal and the second logic portion is driven by the second clock signal. The selection device selects the first clock signal for testing the first clock generator and selects the third clock signal for testing the first logic portion.

DESCRIPTION OF THE DRAWINGS

The invention can be more fully understood by the subsequent detailed description and examples with reference made to the accompanying drawings, wherein.

DETAILED DESCRIPTION

The invention provides an embodiment of a testing method of a chip for preventing sampling error caused by asynchronous effect.

Figure 3:
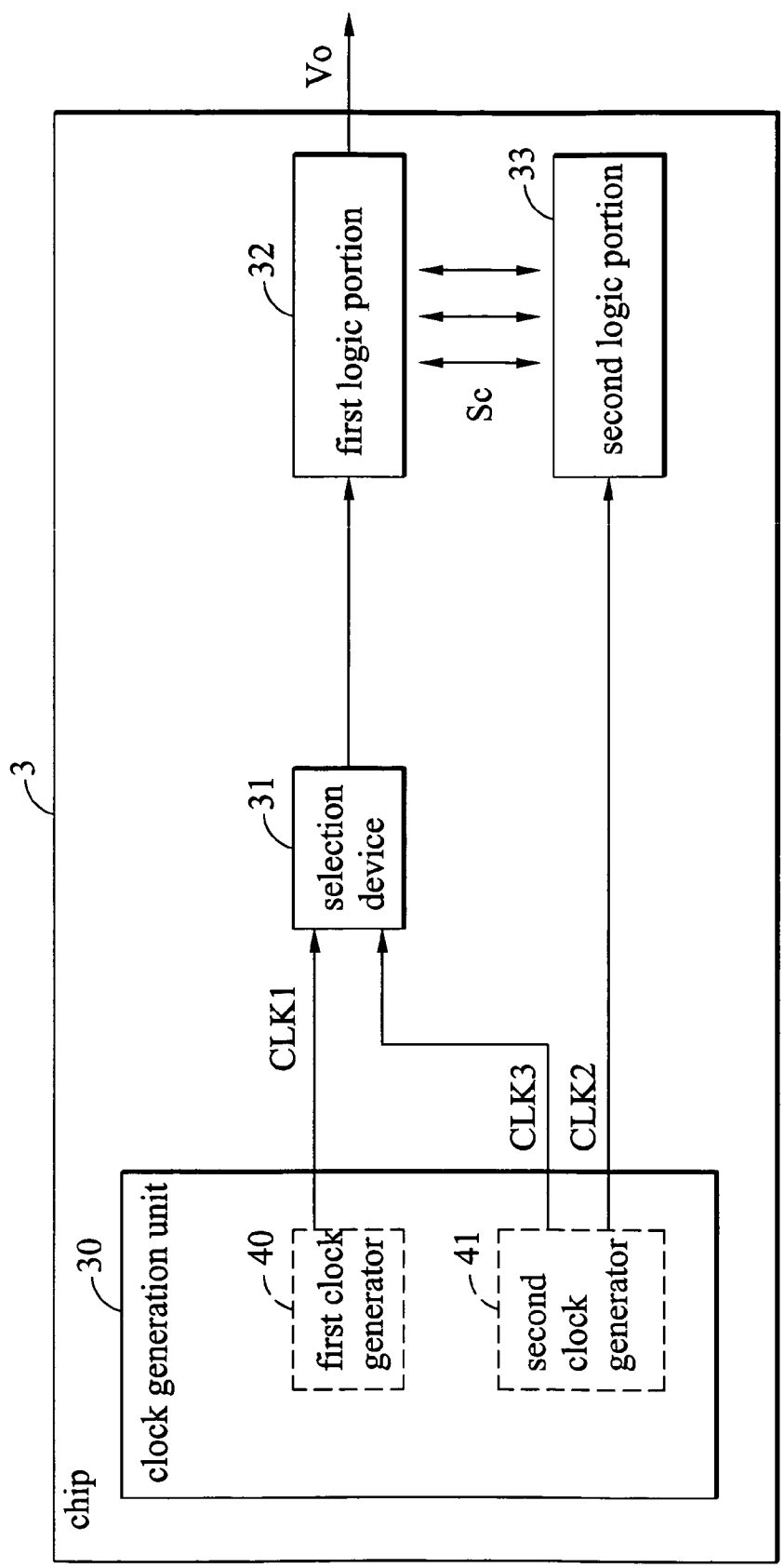
FIG. 3 shows an embodiment of a chip according to the invention.

FIG. 3 shows a chip capable of the testing method of this embodiment. As shown, the chip 3 includes a clock generation unit 30, a selection device 31, a first logic portion 32, and a second logic portion 33. The clock generation unit 30 includes a first clock generator 40 for generating a first clock signal CLK1, and a second clock generator 41 for generating a second and a third clock signals CLK2 and CLK3, in which the clock signal CLK3 is generated according to CLK2. The operating frequency f1 of clock signal CLK1 is higher than the operating frequency f2 of clock signal CLK1 CLK2, and furthermore the operating frequency f1 is not an integral multiple of the operating frequency f2. Under normal operation, the first logic portion 32 is driven by the clock signal CLK1 and the second logic portion 33 is driven by the clock signal CLK2. The selection device 31 selects clock signal CLK1 or clock signal CLK3 for normal operation and selects clock signal CLK2 for testing the chip respectively. The selection device 31,for example, is multiplexer, and the first and second clock generators 40 and 41, for example, are phase locked loop (PLL) circuits.

In this embodiment, assuming the chip 3 is a graphic processing unit, which executes instructions from a central processing unit (not shown) by the first logic portion 32 and controlling a computer graphics interface (not shown) by the second logic portion 33.

Assuming the operating frequency f1 of the clock signal CLK1 is 250 MHz and the operating frequency f2 of the clock signal CLK2 is 66 MHz. However, because the operating frequency f1 is not an integral multiple to the operating frequency f2, the asynchronous effect occurs during testing the chip 3 by clock signals CLK1 and CLK2.

In the present invention, the selection device 31 selects the clock signal CLK3 to replace the clock signal CLK1 when testing. That is, clock signals CLK2 and CLK3 are respectively applied to the first logic portion 32 and the second logic portion 33 when testing. It's noticed that the operating frequency f3 of the clock signal GLK3 is a integral multiple of the operating frequency f2. For example, the third operating frequency can be 133 MHz, 266 MHz and so on. Furthermore, the operating frequency f3 satisfies the following requirements: and (K is an integer). For example, if operating frequency f1 is equal to 250 MHz and operating frequency f2 is equal to 66 MHz, thus f3 is equal to 266 MHz.

When the first logic portion 32 receives the third clock signal CLK3 and the second logic portion 33 receives the second clock signal CLK2, the first and second logic portions 32 and 33 communicate with each other by logic signal Sc and execute corresponding operations. Thus, when the first logic portion 32 receives the third clock signal CLK3 and the logic signal Sc, the first logic portion 32 can sample signals input thereto according to the third clock signal CLK3 and the logic signal Sc and outputs a corresponding test signal.

Figure 4:
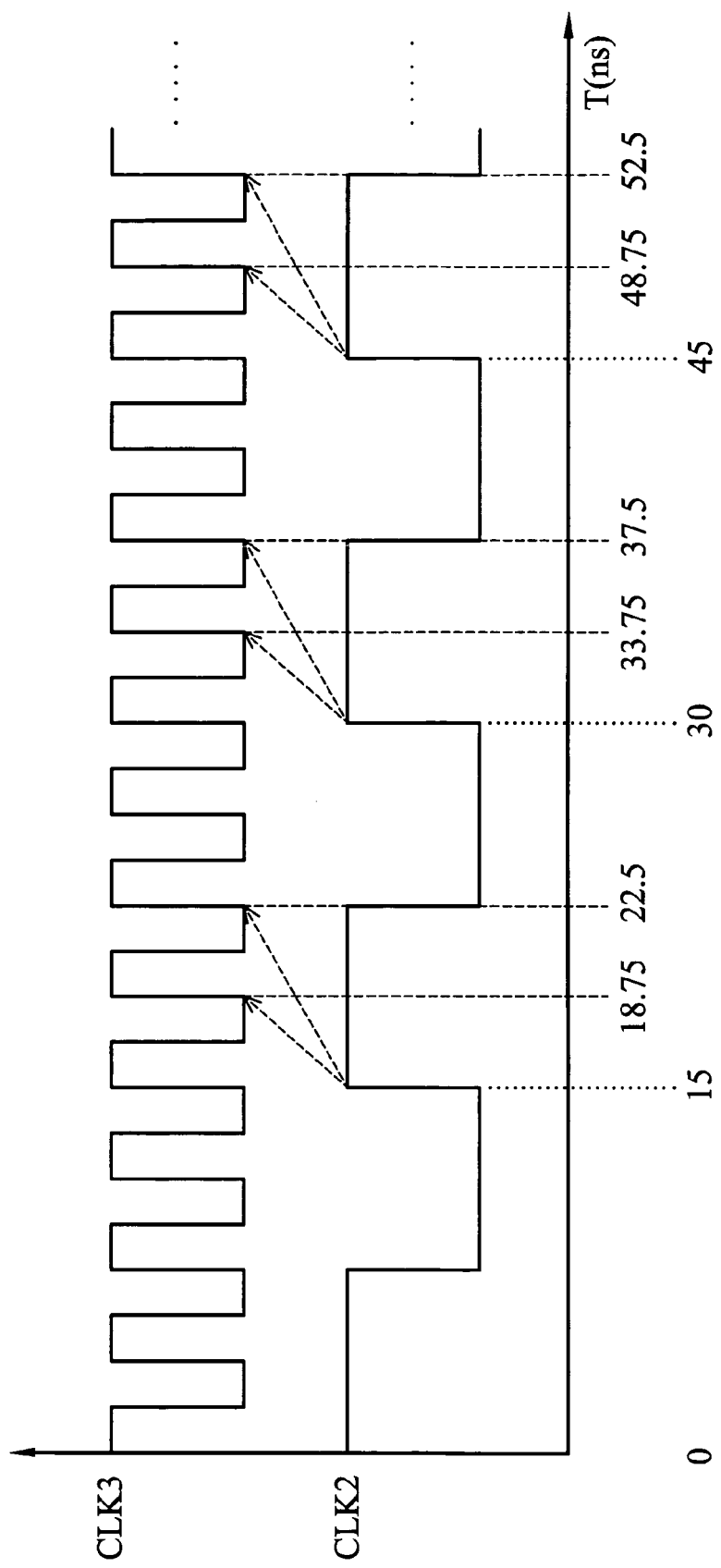
FIG. 4 is a wave diagram of the clock signals CLK2 and CLK3 for testing the chip.

FIG. 4 shows a wave diagram of the clock signals CLK2 and CLK3. The second operating frequency f2 of the clock signal CLK2, for example, is 66 MHz, and the third operating frequency of the clock signal CLK3 is 266 MHz.

As shown in FIG. 4, when the first logic portion 32 outputs logic signal Sc at 15 ns, the second logic portion 33 may sample the received signals at 18.75 or 22.5, ns and output corresponding test signals. Thus, the sampling latency of the first logic portion 32 can be 3.75 (17.75−15=3.75) or 7.5 (22.5−15=7.5) ns. Similarly, when the first logic portion 32 outputs logic signal Sc at 30 ns, the sampling latency of the first logic portion 32 can be 3.75 (33.75−30=3.75) or 7.5 (37.5−30=7.5) ns. Also, when the first logic portion 32 outputs logic signal Sc at 45 ns, the sampling latency of the first logic portion 32 can be 3.75 (48.75−45=3.75) or 7.5 (52.5−45=7.5) ns.

As described above, when chip 3 is tested by the clock signal CLK3 (266 MHz) rather than by the clock signal CLK1 (250 MHz), the sampling latency in each sample period are all the same. Thus, when the sampling latency time of logic circuit in the first logic portion 32 is less 3.75 ns, the first logic portion 32 can obtain accurately sampled signals due to the same sampling latency.

Figure 1:
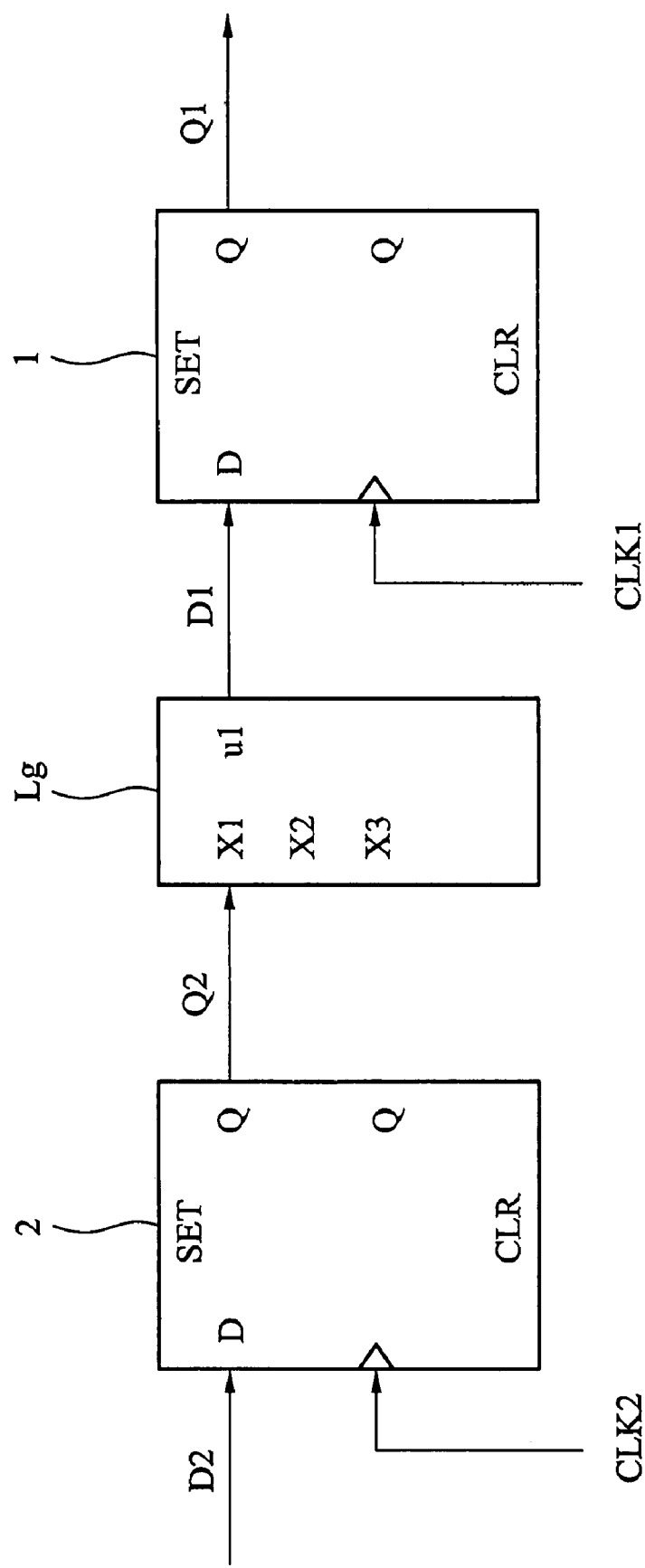
FIG. 1 shows a typical flip-flop circuit.
Figure 2:
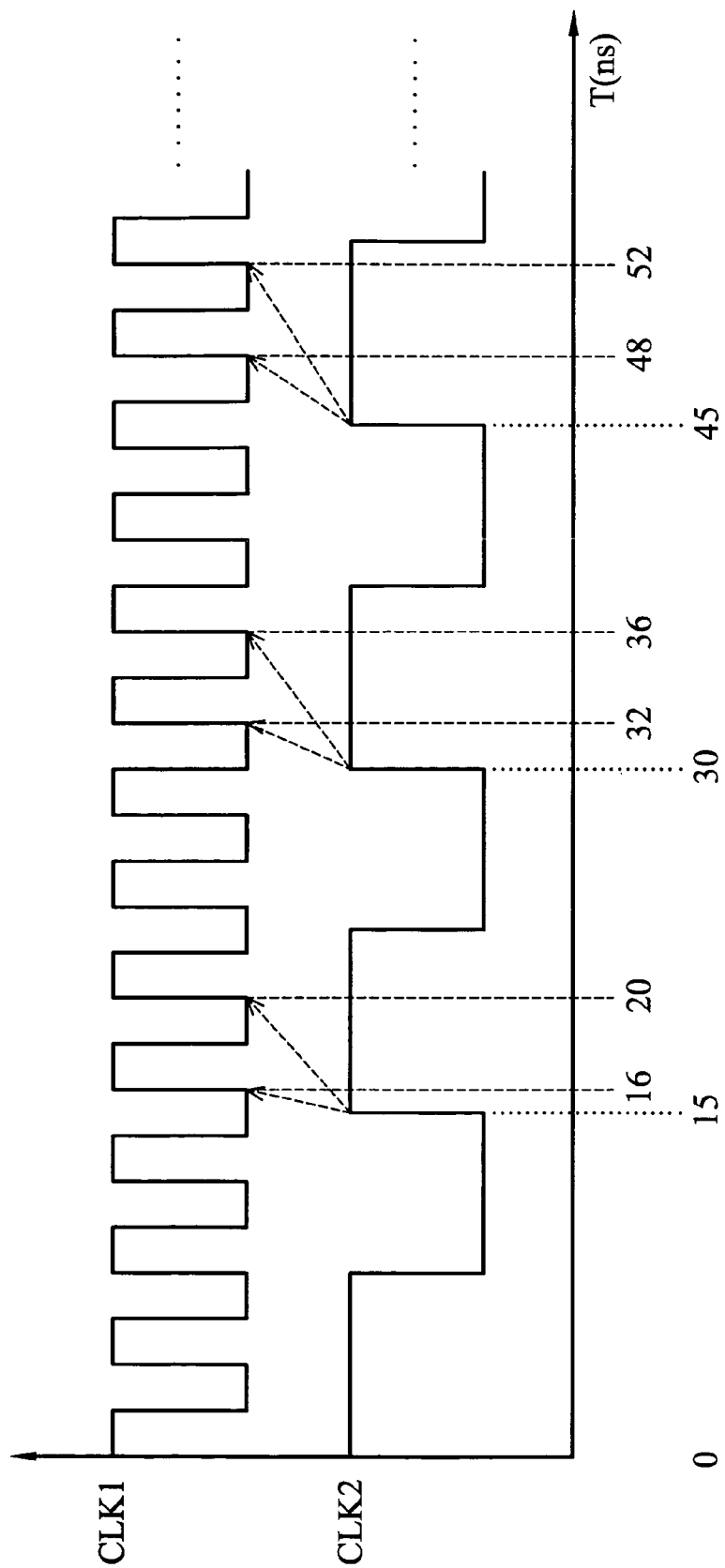
FIG. 2 is a wave diagram of the clock signals CLK1 and CLK2 in FIG. 1.

In comparison to the prior art shown in FIG. 2, the latency limitation of the prior art must be less than 1 ns, 2 ns and 3 ns, the latency in the present invention is only limited to less than 3.75 ns. Therefore, the invention effectively prevents sampling error caused by asynchronous effect.

When testing the second logic portion 33 by the clock signal CLK2, whether the second clock generator 41 normally outputs the clock signal CLK2 is determined by an output signal from the second logic portion 33. Further, when testing the first logic portion 32 by the clock signal CLK3, whether the second clock generator 41 normally outputs the clock signal CLK3 is determined by an output signal from the first logic portion 33.

In the testing method of the embodiment, the first clock generator 40 for generating the clock signal CLK1 can also be tested. In order to test the first clock generator 40, the first logic portion 32 is set to operate independent of the second logic portion 33, namely there are no logic signals Sc between the first and second logic portions 32 and 33. The first clock signal CLK1 is applied to test the first logic portion 32, and whether the first clock generator 40 normally outputs the first clock signal CLK1 is determined by an output signal from the first logic portion 32.

Figure 5:
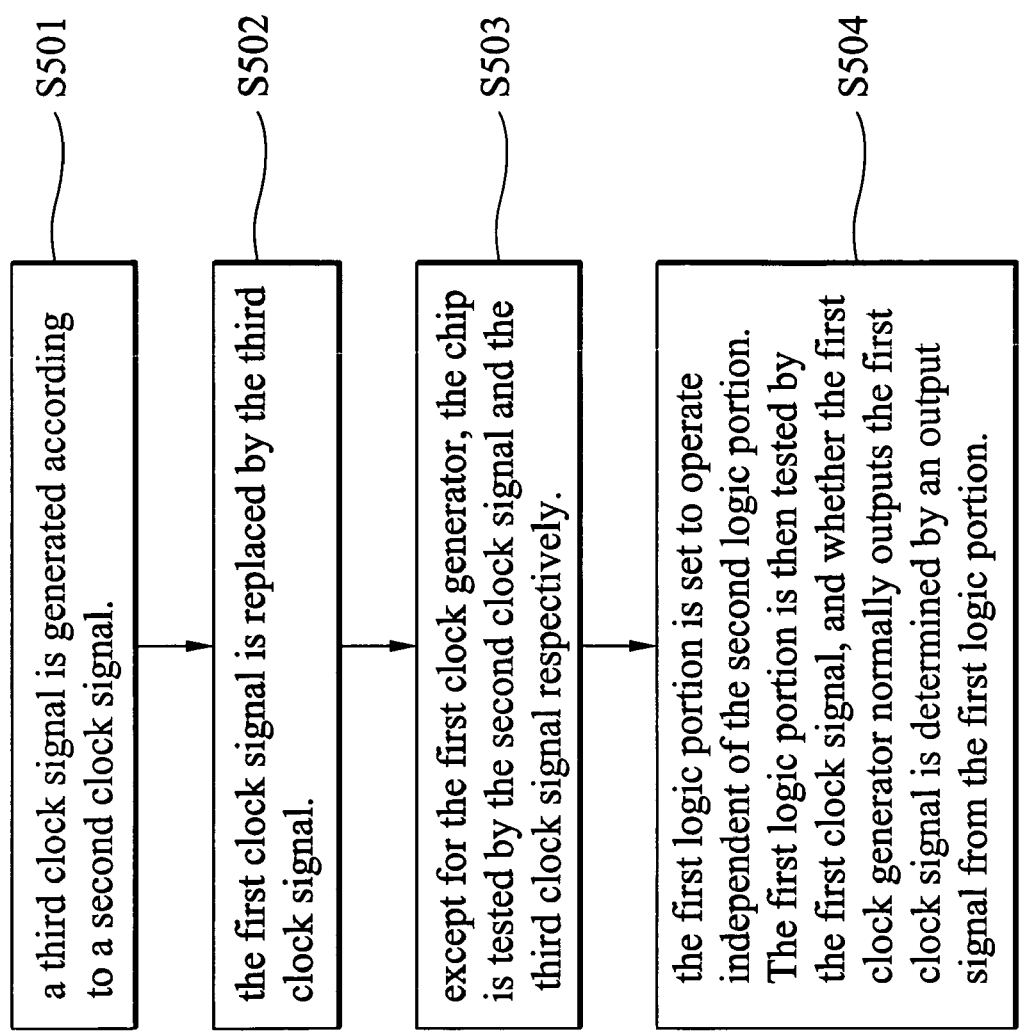
FIG. 5 is a flowchart of a chip test method of an embodiment.

FIG. 5 is a flowchart that shows a testing method of the present invention.

Firstly, a first clock signal CLK1, a second clock signal CLK2 and a third clock signal CLK3 are respectively generated (S501). Wherein the operating frequency f3 of the clock signal CLK3 satisfies the requirements of f3=f2×K, and f2×(K−1)<f1<f3. Secondly, the first clock signal CKL1 is replaced by the third clock signal CLK3(S502); and then respectively testing all devices of chip 3 except for the first clock generator 40 by clock signals CLK2 and CLK3 (S503). Finally, being the first logic portion 32 independent to the second logic portion 33, testing the first logic portion 32 by the first clock signal CLK1, and determining if the first clock generator 40 normally outputs the first clock signal CLK1 according to the output signal Vo from the first logic portion 32.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A synchronous testing method for a chip, wherein the chip comprises a first logic portion driven by a first clock signal and a second logic portion driven by a second clock signal, the testing method comprising:
   generating the first clock signal, the second clock signal and a third clock signal, wherein the third clock signal is generated according to the second clock signal;
   testing the first logic portion according to the third clock signal; and
   testing the second logic portion according to the second clock signal;
   wherein a first operating frequency of the first clock signal is higher than the second operating frequency of the second clock signal and is not an integral multiple of the second operating frequency; and the third operating frequency of the third clock signal is higher than the first frequency and is an integral multiple of the second operating frequency.

2. The method as claimed in claim 1, wherein the first, second and third operating frequencies are f1, f2 and f3 respectively, the operating frequencies satisfy the requirements of f3=f2×K, and f2×(K−1)<f1<f3, wherein K is an integer.

3. The method as claimed in claim 1, wherein the first clock signal is generated by a first clock generator, and the method further comprises:
   setting the first logic portion to operate independent of the second logic portion; and
   applying the first clock signal to the first logic portion.

4. An asynchronous testing chip comprising:
a first clock generator for generating a first clock signal;
a second clock generator for generating a second clock signal and a third clock signal;
a selection device for receiving the first clock signal or the third clock signal and selecting the first clock signal or the third clock signal;
a first logic portion coupled to the selection device, wherein the first logic portion is tested by the selected clock signal from the selection device; and
a second logic portion coupled to the second clock generator for receiving the second clock signal;
wherein a third operating frequency of the third clock signal is higher than a first operating frequency of the first clock signal and is an integral multiple of a second operating frequency of the second clock signal.

5. The asynchronous testing chip as claimed in claim 4, wherein when the first operating frequency is higher than the second operating frequency and is not an integral multiple of the second operating frequency, the selection device selects the third clock signal for testing the first logic portion.

6. The asynchronous testing chip as claimed in claim 5, wherein the first logic portion is set to operate independent of the second logic portion when testing the first clock generator.

7. The asynchronous testing chip as claimed in claim 4, wherein when the first operating frequency is higher than the second operating frequency and is an integral multiple of the second operating frequency, the selection device selects the first clock signal for testing the first logic portion.

8. The asynchronous testing chip as claimed in claim 7, wherein the first, second and third operating frequencies are f1, f2 and f3 respectively, the operating frequencies satisfy the requirements of $f3=f2\times K$, and $f2\times(K-1)<f1<f3$, wherein K is an integer.

9. The asynchronous testing chip as claimed in claim 4, wherein the second logic portion is tested by the second clock signal.

10. The asynchronous testing chip as claimed in claim 4, wherein the selection device selects the first clock signal to test the first clock generator.

11. The asynchronous testing chip as claimed in claim 4, wherein the first clock generator is a phase locked loop (PLL) circuit.

12. The asynchronous testing chip as claimed in claim 4, wherein the second clock generator is a phase locked loop (PLL) circuit.

13. The asynchronous testing chip as claimed in claim 4, wherein the selection device is a multiplexer.

14. An asynchronous testing chip comprising:
a selection device for receiving a first clock signal and a third clock signal and selecting the first or third clock signals;
a first logic portion coupled to the selection device, wherein the first logic portion is tested by the selected clock signal from the selection device; and
a second logic portion coupled to a second clock signal;
wherein a third operating frequency of the third clock signal is higher than a first operating frequency of the first clock signal and is an integral multiple of a second operating frequency of the second clock signal.

15. The asynchronous testing chip as claimed in claim 14, wherein the selection device selects the third clock signal to test the first logic portion.

16. The asynchronous testing chip as claimed in claim 14, wherein the second logic portion is tested by the second clock signal.

17. The asynchronous testing chip as claimed in claim 14, further comprising a first clock generator for generating the first clock signal.

18. The asynchronous testing chip as claimed in claim 17, wherein the selection device selects the first clock signal to test the first clock generator.

19. The asynchronous testing chip as claimed in claim 18, wherein the first logic portion is set to operate independent of the second logic portion when testing the first clock generator.

20. The asynchronous testing chip as claimed in claim 17, wherein the first clock generator is a phase locked loop (PLL) circuit.

21. The asynchronous testing chip as claimed in claim 14, further comprising a second clock generator for generating the second clock signal and the third clock signal.

22. The asynchronous testing chip as claimed in claim 21, wherein the second clock generator is a phase locked loop (PLL) circuit.

23. The asynchronous testing chip as claimed in claim 14, wherein the selection device is a multiplexer.

24. The asynchronous testing chip as claimed in claim 14, wherein the first, second and third operating frequencies are f1, f2 and f3 respectively, the operating frequencies satisfy the requirements of $f3=f2\times K$, and $f2\times(K-1)<f1<f3$, wherein K is an integer.

* * * * *